US011452100B2

(12) United States Patent
Petersen et al.

(10) Patent No.: US 11,452,100 B2
(45) Date of Patent: Sep. 20, 2022

(54) LOW LATENCY WIRELESS PROTOCOL FOR AUDIO AND GAMING

(71) Applicant: RTX A/S, Norresundby (DK)

(72) Inventors: Jens Toftgaard Petersen, Svenstrup J (DK); Flemming Mortensen, Aalborg (DK)

(73) Assignee: RTX A/S

( * ) Notice: Subject to any disclaimer, the term of this patent is extended or adjusted under 35 U.S.C. 154(b) by 0 days.

(21) Appl. No.: 17/253,463

(22) PCT Filed: Jul. 3, 2019

(86) PCT No.: PCT/EP2019/067851
§ 371 (c)(1),
(2) Date: Dec. 17, 2020

(87) PCT Pub. No.: WO2020/007914
PCT Pub. Date: Jan. 9, 2020

(65) Prior Publication Data
US 2021/0119929 A1    Apr. 22, 2021

(30) Foreign Application Priority Data

Jul. 6, 2018    (EP) .................................... 18182173

(51) Int. Cl.
*A63F 13/235*    (2014.01)
*A63F 13/327*    (2014.01)
(Continued)

(52) U.S. Cl.
CPC ....... *H04W 72/0453* (2013.01); *A63F 13/235* (2014.09); *A63F 13/327* (2014.09);
(Continued)

(58) Field of Classification Search
CPC .... A63F 13/30–34; H03M 13/03–098; H03M 13/31–336; H03M 13/65–6597;
(Continued)

(56) References Cited

U.S. PATENT DOCUMENTS 6,442,143 B1    8/2002    Corry
7,230,908 B2    6/2007    Vanderaar et al.
(Continued)

FOREIGN PATENT DOCUMENTS

WO    2006077284 A1    7/2006
WO    2018041251 A1    3/2018

*Primary Examiner* — Timothy J Weidner
(74) *Attorney, Agent, or Firm* — BakerHostetler

(57) ABSTRACT

A wireless communication method and protocol for wireless RF transmission of data, e.g. audio data, with low latency. The method involves a fixed part (FP) serving as synchronization master, and one or more portable parts (PP) being synchronization slaves. The FP performs scanning between a set of supported channels within one limited frequency band, such as within an ISM band. Further, the FP performs collecting measures of RF interference level on at least a plurality of the supported channels in response to the scanning, preferably using own interference level measurement and by collecting RSSI data from the PP for the supported channels. In response to these measures of RF interference level, the FP executes a selection algorithm for selecting and re-selecting first and second different frequencies for respective first and second duplex RF bearers from the set of supported channels to select the channels with least RF interference. Finally, the FP transmits, in one frame of such as 1 ms to 3 ms length, the same data packet on both of said first and second duplex RF bearer frequencies to the PP. This provides a robust and low latency wireless interface suitable for Human Interface Devices and audio devices, e.g. for gaining equipment.

15 Claims, 3 Drawing Sheets

(51) Int. Cl.
*H03M 13/09* (2006.01)
*H03M 13/31* (2006.01)
*H04B 7/04* (2017.01)
*H04B 7/12* (2006.01)
*H04B 17/345* (2015.01)
*H04B 17/373* (2015.01)
*H04J 1/04* (2006.01)
*H04J 1/16* (2006.01)
*H04L 1/00* (2006.01)
*H04L 1/08* (2006.01)
*H04L 5/00* (2006.01)
*H04L 43/0829* (2022.01)
*H04L 47/32* (2022.01)
*H04L 67/12* (2022.01)
*H04L 69/14* (2022.01)
*H04W 24/10* (2009.01)
*H04W 28/08* (2009.01)
*H04W 72/04* (2009.01)
*H04W 72/08* (2009.01)
*H04W 84/20* (2009.01)
*H04W 88/08* (2009.01)
*H04W 92/10* (2009.01)

(52) U.S. Cl.
CPC ........... *H03M 13/09* (2013.01); *H03M 13/31* (2013.01); *H04B 7/04* (2013.01); *H04B 7/12* (2013.01); *H04B 17/345* (2015.01); *H04B 17/373* (2015.01); *H04J 1/04* (2013.01); *H04J 1/16* (2013.01); *H04L 1/004* (2013.01); *H04L 1/08* (2013.01); *H04L 5/0005* (2013.01); *H04L 5/0098* (2013.01); *H04L 43/0829* (2013.01); *H04L 47/32* (2013.01); *H04L 67/12* (2013.01); *H04L 69/14* (2013.01); *H04W 24/10* (2013.01); *H04W 28/085* (2013.01); *H04W 72/082* (2013.01); *H04W 88/08* (2013.01); *H04W 92/10* (2013.01)

(58) Field of Classification Search
CPC ... H04B 7/02–12; H04B 17/0082–3913; H04J 1/02–20; H04J 3/02–26; H04J 11/0023–0093; H04J 2011/0003–0096; H04L 1/0001–248; H04L 5/0001–0098; H04L 7/0004–10; H04L 43/02–50; H04L 47/10–41; H04L 67/12–125; H04L 69/14; H04L 69/26; H04W 8/22–245; H04W 24/02–10; H04W 28/02–26; H04W 36/0005–385; H04W 56/0005–003; H04W 72/005–14; H04W 76/10–50; H04W 84/005–22; H04W 88/02–12; H04W 92/02; H04W 92/04; H04W 92/10
See application file for complete search history.

(56) References Cited

U.S. PATENT DOCUMENTS

| | | | |
|---|---|---|---|
| 9,203,533 B2 | 12/2015 | Coker et al. | |
| 9,848,420 B2 | 12/2017 | Bai et al. | |
| 2002/0097681 A1* | 7/2002 | Treister | H04W 84/20 |
| 2010/0022189 A1* | 1/2010 | Coker | H04H 20/33 |
| 2014/0025854 A1* | 1/2014 | Breuninger | H04L 5/0007 |
| 2016/0345311 A1 | 11/2016 | Chen et al. | |
| 2018/0014312 A1 | 1/2018 | Ezaki | |
| 2018/0049198 A1 | 2/2018 | Viger et al. | |

* cited by examiner

| RSY | D_A PRB | SNC | MAC SGN | APL | MIC | CRC | GRD DLY |

FIG. 3a

| RSY | D_A PRB | SNC | MAC SGN | AS | APL 1 | APL 2 | MIC | CRC | GRD DLY |

FIG. 3b

| RSY | D_A PRB | SNC | MAC SGN | AS | DVA | APL | MIC | CRC | GRD DLY |

| F1 | HID1 Data0 | | ~~HID1 Data1~~ | | ~~HID1 Data1~~ | | ~~HID1 Data1~~ (*) | | HID2 Data1 | | HID2 Data2 |
|----|------------|--|----------------|--|----------------|--|--------------------|--|------------|--|------------|
| F2 | | HID2 Data0 | | ~~HID1 Data1~~ | | ~~HID1 Data1~~ | | ~~HID2 Data1~~ | | HID1 Data2 | |

FIG. 5a

| F1 | HID1 Data0 | | HID2 Data0 | | ~~HID1 Data1~~ | | ~~HID1 Data1~~ | | ~~HID2 Data1~~ | | HID1 Data2 |
|----|------------|--|------------|--|----------------|--|----------------|--|----------------|--|------------|
| F2 | | ~~HID1 Data0~~ | | HID2 Data0 | | ~~HID1 Data1~~ | | ~~HID1 Data1~~ * | | HID2 Data1 | |

FIG. 5b

LOW LATENCY WIRELESS PROTOCOL FOR AUDIO AND GAMING

CROSS-REFERENCE TO RELATED APPLICATIONS

This application is a 371 National Stage of International Patent Application no. PCT/EP2019/067851 filed on Jul. 3, 2019, which claims priority to EP application no. 18182173.7 filed on Jul. 6, 2018, the entireties of which applications are incorporated by reference herein for any and all purposes.

FIELD OF THE INVENTION

The present invention relates to the field of wireless transmission, such as wireless transmission of data with low latency (delay) and still with a high immunity against packet loss. Specifically, the protocol is suited for wireless transmission of audio and other data of Human Interface Devices (HIDs) such as in gaming. Thus, the wireless protocol is advantageous for microphones, musical instruments, and gaming equipment such as keyboard, mouse, game controller, microphone, headphone and headset, or for video applications e.g. as part of Virtual Reality devices.

BACKGROUND OF THE INVENTION

Real-time bidirectional audio applications like headsets, microphones and monitor speakers typically require communications system with minimum latency. Further, devices for gaming, e.g. a game controller, keyboard, mouse or microphone/headphone or headset, are sensitive with respect to any delay which may cause disturbance e.g. in an on-line game setup.

This may be difficult to achieve with known wireless connections which are influenced by various RF interference sources that causes packet losses and thus further delays signal transmission.

SUMMARY OF THE INVENTION

Thus, according to the above description, it is an object of the present invention to provide a wireless communication protocol for reliable wireless transmission of a digital signal in data packets, e.g. audio data, with a low latency. E.g. to allow wireless transmission of signals for gaming devices or other devices requiring a low latency.

In a first aspect, the invention provides a method for wireless RF transmission of a digital signal in data packets between a fixed part (FP) being a timing master and one or more portable parts (PP) being timing slaves, wherein the wireless RF transmission, e.g. involving duplex transmission, and wherein the wireless RF transmission comprises frames each containing one or more time slots, the method comprising scanning, by the FP, e.g. sequentially, between a set of at least three, such as 10-100, such as 40-80, supported channels within one limited frequency band, such as within an ISM band, collecting, by the FP, measures of interference level on at least a plurality of the supported channels in response to the scanning, selecting, by a selection algorithm in the FP, first and second different frequencies for respective first and second RF bearers from the set of supported channels in response to the measure of interference level on the plurality of the supported channels, and transmitting, in one frame, the same data packet on both of said first and second RF bearers from the fixed part FP to the one or more portable parts PP.

Such method is advantageous, since the method is based on transmitting redundant data on two RF bearers with different frequencies. The data packets can be such as Human Interface Device (HID) data and/or audio data. The two RF bearers are even selected based on measures of actual interference levels, thus it is possible to select two frequencies among e.g. 40 supported channels, with the minimal RF interference. The frequencies of the two duplex bearers are to be understood to be dynamically allocated and reallocated in order avoid or minimize interference and to cause minimum interference to other users of the same frequency band. Especially, it is preferred that each frame has at least one, preferably two time slots allocated for scanning. This minimizes the risk of packet losses during RF transmission, and it is possible to use RF bearer frequency bands known to have interfering RF sources, and still a reliable data packet transfer can be obtained with a low latency. Especially, frame length of such as 1 ms to 3 ms are possible.

Preferably, the method maintains two duplex RF bearers operating on the two selected channels. The application payload and the information in the control and signalling field are typically duplicated for transmission on both bearers for redundancy. This provides high reliability of data transfer in frequency bands with presences of interference from other RF devices. The other users may be systems of same technology or systems of other wireless technologies, e.g. based on WiFi or Bluetooth. The frequency selection procedure is preferably dynamically, i.e. continuously, performed, and thus the system will be adaptive and robust also to changes in RF interference. Also, an effect is that the transmission distance is longer than with traditional transmission methods.

Thus, the method involves both time diversity and frequency diversity by the transmission of the same data in two different timeslots and on two different channels.

The below phrases will be used and are therefore explained:

Communication direction from FP to PP is denoted downlink.

Communication direction from PP to FP is denoted uplink.

Time Division Multiple Access (TDMA).

Received Signal Strength Indicator (RSSI).

Human Interface Device (HID), e.g. keyboard, controller, mouse etc.

Cyclic Redundancy Check (CRC) for error check and possible correction of data.

A single radio event e.g. transmit or receive is denoted a slot or time slot.

Two slots on separate frequencies carrying the same application payload can be denoted a dual slot.

A repeated sequence of downlink and uplink slots, including slot(s) for interference scanning (TDMA frame) is denoted a frame.

The same application data, data packet, is sent on two different RF bearer frequencies is denoted redundant transmission.

A channel where data are retransmitted until acknowledged by the receiver is denoted a reliable channel. Sequence numbering prevents duplicated delivery of same data to the application.

The size of user payload available for the application layers above the wireless stack is denoted packet size. This does not include Media Access Control layer signaling fields used internally by the stack.

Interval between transmission of two different application data packets is denoted update interval, e.g. HID update interval.

A fixed part (FP) is the master of the wireless TDMA frame timing. It may in this context be a dongle attached to a PC or gaming console.

A Portable part (PP) is synchronized to the TDMA frame timing of the FP. It may in this context be a wireless device such as a headset, keyboard, mouse, remote controller, etc.

Message Integrity Code (MIC) is used for validation during encryption.

Counter with CBC-MAC (cipher block chaining message authentication code) is denoted CCM.

In the following preferred embodiments and features will be described.

The selection algorithm is preferably arranged to determine the first and second frequencies F1, F2 which are indicated as the RF bearers having the lowest measure of interference level, among all supported channels. In case more interference relevant data are available, e.g. measured values obtained by the FP and possibly also measured RSSI from the PP, the selection algorithm can be designed in different ways. Further, it is to be understood that in case two frequencies are currently being used, the selection algorithm may have a certain threshold for determining to change one or both frequencies, since such frequency handover can involve several frames and acknowledgement from the PP or PPs in order to be effectuated. Preferably, the selection algorithm may change frequency in case of a certain risk of corruption, e.g. if signal and interference margin is found to be lower than a threshold.

The collecting of measures of interference level on the plurality of the supported channels which is used by the selection algorithm for selecting the first and second frequencies may comprise one or more of:

1) Measuring, by the FP, a level of RF activity in the respective frequency bands for RF bearers of each of the plurality of the supported channels.
2) Collecting reported measurement data from the one or more portable part (PP) to the fixed part (FP) a channel quality indicator value measured for a plurality of the supported channels, such as RSSI level. Especially, each frame may comprise a field for reporting at least a part of a RSSI value for one of the supported channel, so as to allow the FP to collect a complete set of RSSI values for all supported channels over a period of time.
3) Determining a frequency distance between a currently used duplex RF bearer and another channel of the supported channels.
4) Determining packet error rates for a plurality of the supported channels. Especially, the FP may calculate statistics of packet error rates for each of the supported channels, such as implemented by a digital Infinite Impulse Response filter operating on received packet acknowledge bits from the PP.

Especially, the selection algorithm may be arranged to select the first and second frequencies in response to a combination of two or more of 1)-4) mentioned in the foregoing.

A preferred frame configuration for the invention is a configuration where the frame comprises a first part allocated for RF transmission of the data packet at the first RF bearer, a second part allocated for RF transmission of the data packet at the second RF bearer, wherein the first and second parts are separated by a third part allocated for scanning of the supported channels. Especially, the first part may comprise at least one time slot for downlink data, and one or more time slots for uplink data. The frame may further comprise a fourth part allocated for scanning of the supported channels. A preferred time length of a frame is: 1 ms to 5 ms, more preferably 1 ms to 3 ms.

Each time slot preferably comprises a Cyclic Redundancy Check (CRC) error check field. Especially, seeding of the CRC derived from system identity can be used for discriminating packets between multiple systems.

The RF transmission on the first and second RF bearers preferably involves duplex transmission between the FP and the PP.

The set of supported channels preferably has RF bearers located within a frequency range of less than 100 MHz, such as within 80 MHz. A frequency distance between two of the supported channels is preferably below 5 MHz, such as below 3 MHz, such as below 2 MHz. E.g. the first and second frequencies may be selected within the frequency range 2.402-2.480 GHz. However, it is to be understood that other RF bands can be used as well, e.g. any ISM band.

For frequency handover, i.e. when a new frequency has been selected by the FP for the first or second RF bearer, the FP preferably transmits information to the one or more PP about the new frequency and a value indicating a number of frames until the first or second RF bearer will be shifted to the new frequency. To further ensure a smooth handover, the handover procedure is not considered as completed before receipt of an acknowledgement of a successful transmission of a data packet on frequency.

To further increase communication range and transmission reliability, antenna diversity can be used, i.e. using two or more antennas on both FP and PP for transmitting and receiving, which adds space diversity additionally. In preferred embodiments, each time slot preferably has an antenna probe field, in which the transmitter emits power, either modulated or unmodulated. The receive performs RSSI measurement during this field on one or more of the supported receive antennas in sequential manor. In the antenna probe fields of following frames, RSSI measurements are performed on the other antennas. After N frames, RSSI measurements have been done on all supported receive antennas, and a decision can be made of which antenna that provides the strongest receive signal. This antenna will be used for reception of packet signalling and applications payload. When a packet has been received correctly on a selected antenna, the same antenna will be used for transmission in the following frames. A change of antenna for transmission may be delayed (synchronized) such that it does not interfere with the antenna decision process of the receiver in the peer.

The digital signal transmitted by the method can in principle be any data signal stream from a HID. Especially, the digital signal may comprise a digital audio signal, such as a digital audio signal sampled at a sampling frequency of 20 kHz or more. The digital audio signal may be an encoded digital audio signal, such as encoded according to an ADPCM algorithm or the like.

In some embodiments, more than the described two frequencies are used. E.g. 3-10 RF frequencies may be selected based on channel scanning to select the 3-10 channels with the lowest interference level. All 3-10 frequencies are then used to transmit redundant data packets in one frame on respective 3-10 RF bearers.

In a second aspect, the invention provides a wireless RF transmitter comprising at least one RF transmitter circuit connected to an antenna, and being arranged to operate as the FP according to the method of the first aspect.

In a third aspect, the invention provides a wireless RF receiver comprising at least one RF receiver circuit connected to an antenna, and being arranged to operate as the portable part PP according to the method according to the first aspect.

It is to be understood that the required RF circuit, antenna and programming required to implement a RF transmitter and RF receiver will be known by the skilled person based on the present description of the inventive method.

In a fourth aspect, the invention provides a system comprising at least one of: the wireless RF transmitter according to the second aspect, and one or more wireless RF receivers according to the third aspect. Especially, the system may be one of: a wireless headset, a wireless mouse, a wireless gaming controller, a wireless keyboard, a wireless microphone, a wireless loudspeaker, and a wireless intercom system, a video system, and a Virtual Reality system.

Audio devices require fixed bandwidth and fixed latency, whereas some HID devices may have different requirements to bandwidth and latency. The requirements to downlink and uplink may be different. However, it is to be understood that all can be complied with in embodiments of the invention.

It is appreciated that the same advantages and embodiments described for the first aspect apply as well the further mentioned aspects. Further, it is appreciated that the described embodiments can be intermixed in any way between all the mentioned aspects.

BRIEF DESCRIPTION OF THE FIGURES

The invention will now be described in more detail with regard to the accompanying figures of which FIGS. 3a-3c illustrates different preferred RF slot formats, FIG. 4 illustrates a preferred frame format, and FIGS. 5a and 5b illustrate example of transmission for combinations of redundant transmission and retransmission.

The figures illustrate specific ways of implementing the present invention and are not to be construed as being limiting to other possible embodiments falling within the scope of the attached claim set.

DETAILED DESCRIPTION OF THE INVENTION

Figure 1:
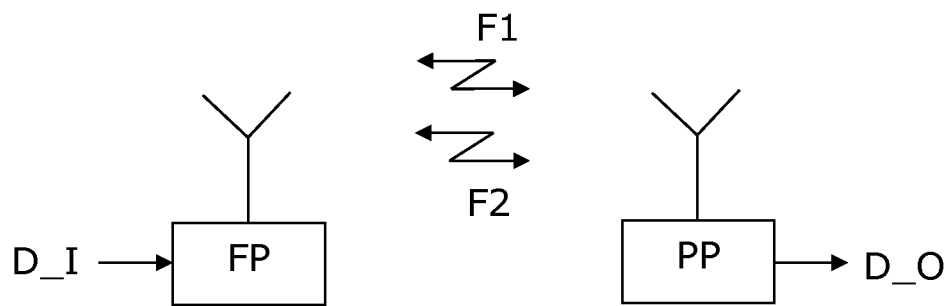
FIG. 1 illustrates a simple block diagram of a system embodiment with a fixed part and a portable part in duplex wireless RF communication on two RF bearer frequencies F1, F2 within a limited RF band.

FIG. 1 shows a block diagram illustrating the basic setup behind the invention, namely a fixed part FP and a portable part PP communicating, here shown as duplex communication, by means of a wireless electromagnetic RF signal on two RF bearers with different frequencies F1, F2. Thus, basically the FP and PP both have RF antennas and RF circuits for transmitting and receiving RF signals with redundant data packets on the two RF bearer frequencies F1, F2. The FP may be implemented as a dongle for a computer, or being an integrated part of e.g. a gaming console or other dedicated device.

The FP receives an input digital signal D_I, and transmits data packets on both RF frequencies F1, F2, and the data packets are received in RF transmitted frames by the PP which unpacks the data packets to arrive at the original data signal D_O.

The FP performs a scanning and preferably performs own measurement as well as collects RSSI data from the PP for the supported channels, do as to dynamically select the two frequencies F1, F2 which according to a predetermined algorithm for finding the frequencies F1, F2 with the minimal possible RF interference from other RF traffic in the RF band covering the supported channels, e.g. an ISM band.

A low latency can be obtained with this two frequency concept which allows the two frequencies to be dynamically updated in response to RF interference level measurements, and further the transmission is reliable, therefore being suited for transmission of audio signals. The low latency and high reliability may e.g. be appreciated for products such as gaming devices with or without audio capabilities.

In FIG. 1 only one PP is shown, however, it is to be understood that embodiments of the invention support broadcasting to a plurality of PPs, i.e. a point to multi-point transmission.

In FIG. 1 only one way audio is shown, but in case e.g. of a headset, it is to be understood that the method of the invention supports embodiments where audio data can be transmitted both uplink and downlink.

Figure 2:
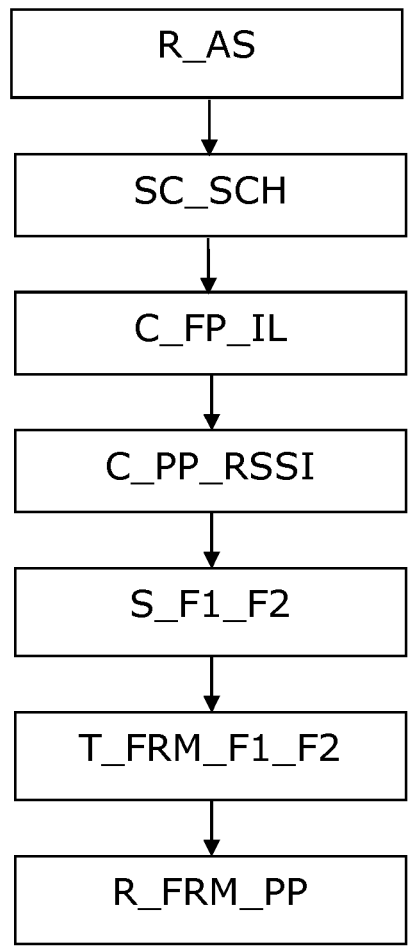
FIG. 2 illustrates steps of a method embodiment.

FIG. 2 illustrates steps of a preferred method embodiment. First step is receiving a digital audio signal R_AS, e.g. audio from a gaming headset, and breaking it into data packets of a predetermined length. The method for wireless RF transmission of a digital signal in data packets between a FP being a timing master and one or more PP being timing slaves. The wireless RF transmission in this embodiment involves duplex transmission, and the wireless RF transmission comprises frames each containing one or more time slots.

The method involves sequentially scanning SC_SCH by the FP between a set of at least three, e.g. such as 10-100, such as 40 or 80, supported channels within one limited frequency band, such as a limited band around 2.4 GHz, wherein the channels closely spaced in frequency, e.g. space by such as spaced by 1-2 MHz.

Next, the FP performs collecting C_FP_IL of its own interference level measurements, e.g. measured RF signal level in each of the supported channels in response to the scanning. Further, utilizing the duplex feature, RSSI data are received from the PP for all supported channels. Based on these data, e.g. involving further data, such as statistics on packet error rates on the supported channels over seen over a period of time, the FP executes a selection algorithm for selecting S_F1_F2 first and second different frequencies for respective first and second duplex RF bearers from the set of supported channels.

Next, the selected frequencies are used for the transmitting T_FRM_F1_F2 one frame with the same data packet on both the first and second RF bearers from the FP to the one or more PP. The PP the receives the RF signal with the frame represented therein, and can then unpack the original digital audio signal data packet.

As already described, the selection algorithm can take into account various measure of interference level in its selection of the first and second frequencies. Especially, the selection algorithm should preferably also decide 1) if at all to change the first and second frequencies for the first and second RF bearer, 2) and if to change at least one of the frequencies, which one to change to, and then also handling the frequency handover for a seamless change. The goal for the selection algorithm is preferably to select frequencies corresponding to the channels with least interference from other RF sources. In a specific implementation, this is achieved by implementation of six procedures, which will be described in the following:
  a) channel interference scanning
  b) reporting channel interference RSSI level
  c) packet error rate statistics
  d) channel packet error rate history
  e) frequency selection
  f) frequency handover procedure a) In each frame an RSSI measurement of interference is performed in the scan slots. There are typically two scan slots in each frame. All the supported channels are scanned sequentially. If the system is supporting 80 channels, after 40 frames all the channels have been scanned. For example, if assuming a frame length of 2 ms, all the supported channels can be scanned in 80 ms. A table with an entry for each channel is implemented. For each table entry, a first order digital IIR filtering algorithm with progressive faster attack time and fixed slower decay times are implemented. The filter attack time is dynamically changed to respond to consecutive measurements of high RSSI levels. Consecutive higher RSSI, that may indicate presence of interference, increases the speed of the attack time. When RSSI is lower, a fixer longer filter decay time is used and the attack time is reduced. This is done because interference may occur only in short bursts and detection probability depends on the interference occurrency. The very same scanning and filtering process is performed in the FP and all the PPs in the network.

b) All the PPs are reporting the information in tables with filtered RSSI level to the FP. The table entries are sent in the control and signalling information field in a sequential cycle. This reporting cycle may different from the scanning and measurement cycle and is adapted to the available signalling bandwidth. For example, 1 or 2 channel entries may on average be reported every second frame and if the system is supporting 80 channels, the complete table information may be reported to the FP in 80 ms to 160 ms.

c) A packet error rate statistic is calculated in the FP for every expected reception of a data packet. Each received packet in FP also contains a receive acknowledgement bit from the PP. This acknowledgement information is also used in calculation of packet error rate (duplex bearer packet error rate). The packet error rate statistics may be implemented as a first order digital IIR filter of packet OK indication and acknowledged bit.

d) The history of packet error rate statistics is recorded for each frequency used for communication. This history information has an aging factor.

e) The FP has implemented a process that determines if the currently used frequencies are preferred or if other frequencies are predicted to have lower packet error rate. This process has decision rules based on combining the following information:
  the local interference RSSI scan information of all supported channels
  reported interference RSSI from the PP of all supported channels
  channel packet error rate history
  current packet error rate
  Local and reported interference information on currently used channels
  Frequency distance to the other used bearer The decision process is searching through all the recorded and filtered interference scan information from all PPs and the FP for finding the channel that indicates the lowest interference level. If the found channel indicates lower interference RSSI than the currently used channel, and if the frequency distance to the other bearer is above a minimum of distance of for example 10 MHz, a frequency handover procedure and protocol is initiated.

f) The two bearers of the system are always operating on two different channels in the same frame. The frequency handover procedure will only be active one bearer at any given time. When frequency handover is complete for one bearer, a frequency handover procedure may be initiated for the other bearer.

The frequency handover procedure is using a signalling protocol where the FP is transmitting the information of the new frequency to be used, included the number of frames until the change shall have effect. The information of the new frequency is transmitted several times for redundancy, including the number of frames until the change is adjusted accordingly. This protocol enables the FP and PPs to change used frequency at the same moment without resulting in any packet loss.

The frequency handover procedure is still in progress until the FP has received correct packets from the PPs on the newly selected frequency. If acknowledgement is not received from the PPs in the newly selected frequency within a timeout limit of for example 200 ms, the decision process is selecting a new frequency and the frequency handover procedure is restarted.

When correct acknowledgement packets have been received from all the connected PP's the frequency handover is complete, and a frequency handover procedure may potentially be initiated for the other bearer.

FIGS. 3a-3c show three different preferred configurations for time slots. The active parts of the generic time slot includes antenna probing D_A PRB to be used for measurements for selecting antenna in case of diversity, synchronization field SNC, MAC signaling control and addressing MAC SGN, application payload APL and CRC protection CRC. Some guard time GRD DLY is required between slots for radio synthesis settling RSY, ramping and processing. The slot formats are utilizing the benefits of fast switching between RX and TX on the same RF frequency.

FIG. 3a, slot format D1 or U1, shows a slot format example for a single physical endpoint.

FIG. 3b, slot format D2 or U2, shows a slot format example for a multiple physical devices or multiple logical endpoints, with application payload for two devices APL 1, APL 2, also including an acknowledgement field AS for addressing packet sequence number for each device.

FIG. 3c, slot format D3, shows a slot format example, where the FP is configured to transmit shared downlink slot to multiple PPs. In this case an additional device addressing field DVA is added. In this configuration, all the portable devices must receive the slots and determine if it is the destination of the application data. This may e.g. be identified utilizing the CRC field by a seeding algorithm based on the system identity, so as to use the CRC field as a hidden system identification carrier for discriminating packets from different systems.

The update interval for HID applications corresponds to the length of the dual slot transmission, which is the same as frame length. The stack can also be configured to retransmit data more times in case of interference. The shortest latency is achieved by not using the redundant transmission feature.

FIG. 4 shows an example of a preferred frame format for a typical communication between an FP and multiple PP devices. A preferred frame comprises one or more transmission slots in each transmission direction. In each frame, a timeslot S is allocated for interference scanning of the complete used frequency spectrum. The information gathered by this scanning is used by the selection algorithm for channel selection and channel re-selection. The downlink slot may be one of the described formats: D1, D2, or D3, for uplink it can be either U1 or U2 of different sizes. In this example, the downlink slot format is D3, and the three uplink slots utilize format U1.

Thus, as seen, in this frame format, the first part for RF transmission at RF bearer with frequency F1 comprises one downlink slots followed by three uplink slots. Next, a scanning slot S follows. The second part for RF transmission at RF bearer F2 is similar to the one for F1: one downlink slots followed by three uplink slots, and finally a second scanning slot S follows.

The highest HID update rate (shortest HID update interval) is achieved when new HID data is allowed to be sent in each transmission, then the update rate corresponds to a half frame. This will be the operation mode when the protocol stack is configured with 0 redundant transmissions. If instead the configuration of redundant transmission is set to 1, the normal dual slot diversity (and frequency diversity) will be used and the update interval corresponds to the frame length. The number of redundant transmissions can be configured to a higher number and consequently the HID update rate will be lower. It is also possible to configure the number of retransmission. If neither the original nor the redundant transmissions are received successfully, potential retransmission are carried out. Then the wireless stack retransmit the data again, until either a successful transmission, or the maximum number of retransmissions are reached.

FIGS. 5a and 5b show two examples of different configuration of redundant transmission and maximum retransmission. The examples show data packets transmitted on the two frequencies F1, F2 in different errors cases. Only packets Data0, Data1, Data2 in one direction are shown. Two HIDs, HID1, HID2 are assumed, and they are scheduled equally by the application. Successful transmitted packets are shown with normal letter, while error packets are show with crossed letters. The asterisk indicates that the protocol stack will trigger a callback when retransmission count has reached max value.

In FIG. 5a the number of redundant transmissions is 0 and with maximum retransmissions being 4, while in FIG. 5b, the number of redundant transmissions is 1 and with maximum retransmission being 2.

The actual number $n_{actual}$ of times a packet is transmitted is defined as:

$$n_{redundant}+1 \leq n_{actual} \leq n_{redundant}+n_{retransmission}+1,$$

where $n_{redundant}$ is the number of redundant transmissions and $n_{retransmission}$ is the maximum number of retransmissions. The redundant and retransmission procedures of multiple devices operate independent of each other. Note, format D3 can only be used to a single device.

In one possible configuration example for 2 HIDs, the downlink channel is shared between the two HIDs and dedicated HID1 and HID2 uplink. There are no redundant transmissions. The downlink scheduling of HID is dynamic and is determined by the application at run time. Thus, the D3 frame format described earlier, is used, as this contains a device addressing field. The requirements to the frame structure are: HID downlink: 16 bytes, HID1 uplink: 14 bytes, HID2 uplink: 22 bytes, encryption: full CCM. Frame length elements: Downlink: 190 μs, Uplink-1: 144 μs, Uplink-2: 176 μs, Scan 50 μs. Thus, a half frame will be 560 μs, and the full frame will be 1120 μs, i.e. only slightly above 1 ms. The resulting HID update intervals in this example are: downlink (shared): 560 μs, uplink from device 1 560 μs, and uplink from device 2: 560 μs.

If the HIDs are scheduled equally in downlink, their resulting downlink update interval is 1120 μs. It is also possible to prioritize one of the HIDs, e.g. HID1 is scheduled in three out of four half frames. In this case, the average HID 1 update interval is 747 μs and the average HID 2 update interval is 2240 μs. These update intervals assume that all transmissions are successfully received. In case of transmission errors, the update interval increases as explained earlier in relation to FIGS. 5a and 5b.

In another configuration example, two HIDs and one audio headset is assumed. This example shows the performance in case of shared downlink channel and 0 redundant transmissions. The requirements are as follows: HID downlink: 16 bytes, HID1 uplink: 14 bytes, HID2 uplink: 22 bytes, audio downlink: 94 bytes, audio uplink: 25 bytes, and encryption: full CCM. This will result in the following frame length elements: downlink (D2): 566 μs, uplink-1 (U1): 144 μs, uplink-2 (U1): 176 μs, uplink-A (U1: 188 μs, scan: 50 μs, alignment: 1 μs. Hereby, a half frame will be 1125 μs, and one frame: 2250 us.

The resulting HID update intervals in this example are: downlink (shared): 1125 us, uplink from device 1: 1125 us, uplink from device 2: 1125 us.

The following features are preferred in a specific embodiment:
Frame format: Downlink1, Uplink1, Scan; Downlink2, Uplink2, Scan;
Slot format: Synthesis Settling, Antenna probe, Sync, Afield, Payload, MIC, CRC
Antenna diversity
Audio buffering method (fixed, short latency)
Seamless frequency handover—the 2 bearers operates independently.
Interference scanning in both end (Fixed part and Portable part)
  PPs report to FP;
  FP decides frequency handover based on local and remote info
Configurable payload size and adaptable frame length
Topology options: point-point and point to multipoint
Application payload: Audio+HID data
Signalling field (Afield) out of band—does not affect application payload
CRC calculation includes seeding by system identity
Encryption of application payload—signalling field is not encrypted.
Binding/registration protocol In a specific embodiment, the MAC/PHY is designed based on the following features:
Frequency range: 2.402-2.480 GHz
Modulation: 2 Mbit/s, GFSK
Data integrity check: CRC-24
Encryption of payload data by AES128, CCM with addition of 32 bit MIC (configurable). The same (shared) security key is used for all FP, PP devices in a network.
Antenna diversity, 2 antennas in both FP and PP.
Interference scanning in both FP and PP, and interference avoidance procedures.
Automatic frequency (re)selection and frequency handover to avoid interference. The frequency handover is preferably done seamless and does not interrupt the flow of application data.

Reliable application data transfer by configurable retransmission, both downlink and uplink. The retransmission procedure uses both active carriers and can be combined with redundant transmission.

MAC layer signaling field carries: synchronization information, addressing, sequence numbering, acknowledgements, interference and frequency management information, antenna control, and binding and connection control commands. The MAC layer signaling does not affect the application payload bandwidth.

The fixed part always transmits at least a synchronization beacon when no portable devices are active.

The following different classes of transmission may be defined:
1) Fixed and reserved transmission bandwidth. Used in downlink and uplink (e.g. for audio transmission).
2) Combined, used in downlink and uplink (e.g. HID and audio in same physical slot)
3) Shared slot type, recipient is determined by addressing or fixed multiplexing rule, used in downlink only.

The data transmission service to be provided in a system according to the invention, to be used by an application, can either support only fixed size payload packets or provide configurable payload packets. The packet size may be configured for downlink and uplink independently and independently for each HID. The data transmission service provided by the system may be configured as a reliable transport, meaning that:
1) error recovery is performed, i.e. data are retransmitted until successfully received and acknowledged (within a retransmission limits). If retransmission limit is reached, the application is informed, and the application may take proper action in such case,
2) no duplicated data is delivered to the application on the receiving side.

To sum up, the invention provides a wireless communication method and protocol for wireless RF transmission of data, e.g. audio data, with low latency. The method involves a fixed part (FP) serving as synchronization master, and one or more portable parts (PP) being synchronization slaves. The FP performs scanning between a set of supported channels within one limited frequency band, such as within an ISM band. Further, the FP performs collecting measures of RF interference level on at least a plurality of the supported channels in response to the scanning, preferably using own interference level measurement and by collecting RSSI data from the PP for the supported channels. In response to these measures of RF interference level, the FP executes a selection algorithm for selecting and re-selecting first and second different frequencies for respective first and second duplex RF bearers from the set of supported channels to select the channels with least RF interference. Finally, the FP transmits, in one frame of such as 1 ms to 3 ms length, the same data packet on both of said first and second duplex RF bearer frequencies to the PP. This provides a robust and low latency wireless interface suitable for Human Interface Devices and audio devices, e.g. for gaming equipment.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method for wireless RF transmission of a digital signal in data packets between a fixed part being a timing master and one or more portable parts being timing slaves, wherein the wireless RF transmission comprises frames each containing one or more time slots, the method comprising
scanning, by the fixed part between a set of at least three supported channels within one limited frequency band,
collecting, by the fixed part, measures of interference level on at least a plurality of the supported channels in response to the scanning,
selecting, by a selection algorithm in the fixed part, first and second different frequencies for respective first and second RF bearers from the set of supported channels in response to the measure of interference level on the plurality of the supported channels, and
transmitting, in one frame, the same data packet on both of said first and second RF bearers from the fixed part to the one or more portable parts.

2. The method according to claim 1, wherein the selection algorithm is arranged to determine the first and second frequencies which are indicated as the RF bearers having the lowest measure of interference level.

3. The method according to claim 1, wherein said collecting of measures of interference level on the plurality of the supported channels comprises measuring, by the fixed part, a level of RF activity in the respective frequency bands for RF bearers of each of the plurality of the supported channels.

4. The method according to claim 1, wherein said collecting of measures of interference level on the plurality of the supported channels comprises collecting reported measurement data from the one or more portable part to the fixed part a channel quality indicator value measured for a plurality of the supported channel.

5. The method according to claim 1, wherein the selection algorithm is further arranged to determine packet error rates for a plurality of the supported channels, and to select the first and second frequencies in response thereto, wherein the fixed part calculates statistics of packet error rates for each of the supported channels.

6. The method according to claim 1, wherein the selection algorithm is arranged to select the first and second frequencies in response to a combination of two or more of:
1) levels of RF activity in the respective frequency bands for RF bearers of each of a plurality of the supported channels,
2) reported measurement data from the one or more portable part to the fixed part indicative of channel quality indicator values measured for a plurality of the supported channels,
3) a frequency distance between a currently used RF bearer and another channel of the supported channels, and
4) packet error rates collected for a plurality of the supported channels.

7. The method according to claim 1, wherein a frame comprises a first part allocated for RF transmission of the data packet at the first RF bearer, a second part allocated for RF transmission of the data packet at the second RF bearer, wherein the first and second parts are separated by a third part allocated for scanning of the supported channels, and wherein a time length of the frame is within 1 ms to 5 ms.

8. The method according to claim 7, wherein the first part comprises at least one time slot for downlink data, and one or more time slots for uplink data.

9. The method according to claim 1, wherein said set of supported channels have RF bearers located within a frequency range of less than 100 MHz, and wherein a frequency distance between two of the supported channel is below 5 MHz.

10. The method according to claim 1, wherein the fixed part (FP) transmits, when a new frequency has been selected for the first or second RF bearer, information to the one or more portable parts about the new frequency and a value indicating a number of frames until the first or second RF bearer will be shifted to the new frequency.

11. The method according to claim 1, wherein the fixed part and the portable part comprises two or more different RF antennas for the RF transmission.

12. The method according to claim 1, wherein each time slot comprises a Cyclic Redundancy Check (CRC) error check field, and wherein seeding of the CRC is used as a hidden system identification.

13. A wireless RF transmitter comprising at least one RF transmitter circuit connected to an antenna, and being arranged to operate as the fixed part according to the method of claim 1.

14. A wireless RF receiver comprising at least one RF receiver circuit connected to an antenna, and being arranged to operate as the portable part according to the method of claim 1.

15. A system comprising at least one of: (i) a wireless RF transmitter comprising at least one RF transmitter circuit connected to an antenna and being arranged to operate as the fixed part according to the method of claim 1, and (ii) one or more wireless RF receivers comprising at least one RF receiver circuit connected to an antenna and being arranged to operate as the portable part according to the method of claim 1, wherein the system is one of:

a wireless headset, a wireless mouse, a wireless gaming controller, a wireless keyboard, a wireless microphone, a wireless loudspeaker, a wireless intercom system, a video system, and a Virtual Reality system.

* * * * *